United States Patent [19]

Lyons et al.

[11] Patent Number: 4,979,664

[45] Date of Patent: Dec. 25, 1990

[54] METHOD FOR MANUFACTURING A SOLDERED ARTICLE

[75] Inventors: Alan M. Lyons, New Providence; Stephen G. Seger, Jr., Bedminster, both of N.J.

[73] Assignee: AT&T Bell Laboratories, Murray Hill, N.J.

[21] Appl. No.: 436,995

[22] Filed: Nov. 15, 1989

[51] Int. Cl.$^5$ .................... B23K 1/012; H05K 3/34
[52] U.S. Cl. .................... 228/180.2; 228/219; 228/234
[58] Field of Search .............. 228/180.2, 219, 234, 228/220, 6.2, 44.7, 123

[56] References Cited

U.S. PATENT DOCUMENTS

| | | | |
|---|---|---|---|
| 3,303,393 | 2/1967 | Hymes et al. | 174/253 |
| 3,475,814 | 11/1969 | Santangini | 228/180.2 |
| 3,705,457 | 12/1972 | Tardoskegyi | 29/494 |
| 3,900,151 | 8/1975 | Schoer et al. | 228/220 |
| 3,912,153 | 10/1975 | Hartleroad et al. | 228/6.2 |
| 4,270,265 | 6/1981 | Ikeda et al. | 29/840 |
| 4,295,596 | 10/1981 | Doten et al. | 228/180.2 |
| 4,605,152 | 8/1986 | Fridman | 228/180.2 |
| 4,615,952 | 10/1986 | Knoll | 428/650 |
| 4,646,958 | 3/1987 | Howard, Jr. | 228/123 |
| 4,659,004 | 4/1987 | Fridman | 228/6.2 |
| 4,693,770 | 9/1987 | Hatada | 228/180.2 |
| 4,702,969 | 10/1987 | Bunkoczy et al. | 428/635 |
| 4,789,096 | 12/1988 | Dunn et al. | 228/180.2 |
| 4,821,947 | 4/1989 | Nowotarski | 228/219 |
| 4,857,671 | 8/1989 | Nakano et al. | 228/180.2 |

FOREIGN PATENT DOCUMENTS 62-81268 4/1987 Japan.

OTHER PUBLICATIONS

IBM Technical Disclosure Bulletin, "Solder Reflow Tool", vol. II, No. 10, p. 1298, Mar. 1969.
IBM Technical Disclosure Bulletin, "Surface Mount Component Lead Hold-Down Mechanism", vol. 31, No. 9, pp. 85–87, Feb. 1989.
Surface Mount Technology, "How to Use Integral Vision and Reflow for Placement of Fine Pitch SMCs", pp. 31, 32, Feb. 1987.
Mizuishi, K. et al, "Fluxless and Substantially Voidless Soldering for Semiconductor Chips," *IEEE 38th Components Conference Proceedings*, May, 1988, pp. 330–334.
Ammann, H. H. et al, "Fluxless Condensation Soldering," Proc. of the Technical Program, *National Electronic Pkg and Prod. Conf.*, Feb. 26–28, 1980, vol. 1, pp. 7–11.

*Primary Examiner*—Sam Heinrich
*Attorney, Agent, or Firm*—Eugen E. Pacher

[57] ABSTRACT

Disclosed is a method for making a solder joint without flux, in the presence of an inert gas. A pair of articles having solder-coated surfaces are heated to melt the solder, pressure is applied to the joint region, and the articles are cooled. During the heating step, inert gas is flowed over the articles.

5 Claims, 1 Drawing Sheet

METHOD FOR MANUFACTURING A SOLDERED ARTICLE

FIELD OF THE INVENTION

This invention relates to the joining of metal parts by soldering, and in particular to the joining of solder-coated surfaces belonging to electronic device packages or electronic device chips to solder-coated contacts.

ART BACKGROUND

Solder connections are widely used in the manufacture of electronic devices such as printed circuit boards. For example, an integrated circuit (IC) is typically enclosed in a package including wire leads attached to the input and output portions of the IC and extending to the outside of the package. The terminal portions of the wire leads are coated with solder. Where the IC package is to be mounted, e.g., on a printed wiring board having formed on its surface an interconnective metal pattern, the metal pattern includes solder-coated contacts corresponding to the leads of the IC package.

To mount the IC package, solder paste, typically comprising solder particules suspended in a mixture of flux and binder, is applied to the printed wiring board. The leads of the IC package are aligned with the printed wiring board. A relatively small amount of force, typically a few thousand dynes, is applied to the entire package in order to force the leads into contact with the paste. The board is then heated to the melting temperature of the solder in a furnace, without any pressure being applied to the joints.

In an alternative procedure that is applied, for example, to packages having very fine pitch, the printed wiring board is reflowed, fluxed, and then a heated member, such as a horizontal bar, descends in a vertical direction, pressing down on, for example, a row of leads. The bar simultaneously heats the leads and applies a relatively small pressure to the leads.

Surface oxide is usually present on the solder-coated regions being joined, and more oxide usually forms during the application of heat (unless oxygen has been removed, excluded, or replaced by non-oxidizing gas near the pieces being joined). As a result of the presence of oxidized regions within the vicinity of the joint, solder joints are usually too mechanically weak and electrically resistive to be useful unless flux is applied to the surfaces that are to be joined.

However, for some applications, the use of flux is extremely undesirable. Flux is corrosive or capable of forming corrosive residues. The quantity of flux that is applied must often be kept within strict limits, because excess flux can cause beads or icidles of solder to form, which may cause short circuits, and paucity of flux may lead to the formation of brittle, porous joints.

Moreover, after the solder joint is made, it is often desirable to remove the flux. This has often been done by cleaning with chlorofluorocarbons (CFCs). Because CFCs have been found to be hazardous to the environment, it is desirable to reduce or eliminate their use. One way to reduce the use of CFCs is to eliminate the use of flux in soldering operations.

To avoid the problems associated with flux, various approaches have been attempted for joining metal parts by soldering, without flux, in a controlled atmosphere from which oxygen has been excluded. For example, a number of investigators have performed fluxless soldering in a reducing atmosphere comprising, for example, carbon monoxide or hydrogen. Although these and similar approaches have proven useful, reducing gases may be flammable or toxic, and therefore must be isolated from the ambient atmosphere by enclosing the parts to be joined within a sealed chamber.

In order to avoid the hazard and inconvenience of reducing atmospheres, various investigators have attempted fluxless soldering in inert atmospheres, comprising, for example, argon or nitrogen. For example, U.S. Pat. No. 3,900,151, issued to H. Schoer and W. Schultze on Aug. 19, 1975, describes a process for the fluxless soldering of aluminum-containing workpieces in a non-oxidizing atmosphere such as nitrogen, using zinc-based solder containing aluminum and one or more additional components. U.S. Pat. No. 4,615,952, issued to R. Knoll on Oct. 7, 1986, also describes a zinc-based, aluminim-containing solder for the fluxless joining of aluminum workpieces in an inert atmosphere. U.S. Pat. No. 4,702,969, issued to B. Bunkoczy et al., on Oct. 27, 1987, describes a method of joining aluminum or titanium workpieces that have been precoated with solder by placing the surfaces to be joined in intimate contact and heating the workpieces in an inert fluorocarbon atmosphere. Bunkoczy mentions that no flux is required when an indium solder is used.

The solder compositions described in the above-mentioned patents are useful for joining aluminum or titanium workpieces, but they are different from the solder compositions commonly used for mounting semiconductor electronic devices. Various other investigators have attempted to perform soldering operations characteristic of the electronics industry without the use of flux by performing such operations in an inert atmosphere. For example, U.S. Pat. No. 3,705,457, issued to L. V. tardoskegyi on Dec. 12, 1972, discusses a fluxless wave-soldering technique in which the undersurface of a relatively flat workpiece is solder-coated by bringing it into contact with a stream of molten solder projected upwardly by a nozzle. A second nozzle discharges a stream of inert gas, such as nitrogen, which flows between the upper surface of the solder stream and the undersurface of the workpiece. Similarly, U.S. Pat. No. 4,821,947, issued to M. S. Nowotarski on Apr. 18, 1989, describes a wave-soldering technique for solder-coating metal surfaces, and for joining metal surfaces, in an inert atmosphere such as nitrogen. According to that technique, the surfaces to be joined are brought into contact with a solder bath.

A fluxless technique for soldering semiconductor chips is described in K. Mizuishi et al., "Fluxless and Substantially Voidless Soldering for Semiconductor Chips," IEEE 38th Components Conference Proceedings, May 1988, pp 330–334. According to this technique, a hollow solder preform is placed between a semiconductor chip and the surface it is to be mounted on. Before this assembly is heated, it is placed in a partial vacuum. During the heating stage, and while the solder is able to flow, the pressure is raised to. e.g., atmospheric pressure, causing molten solder that is essentially free of oxidation to flow into the central void of the preform.

For the purpose of mounting IC packages having wire leads, it is desirable to precoat the wire leads with solder, and also to precoat the surfaces to be joined to the wire leads. Furthermore, it is desirable to complete the joining step in the absence not only of flux, but also of added solder. Although Tardoskegyi and Nowotarski describe techniques that may be practiced using solder compositions that are conventional in the electronics industry, they do not address the problem of mounting precoated electronic components without adding more solder to the joint region. Because the technique described by Mizuishi relies, explicitly, on the use of a solder preform, it, too, fails to address the problem of mounting without additional solder.

Japanese Patent No. 62-81268, "Fluxless Soldering," issued in 1987 to Aoyama, Onuki, and Miyake, describes a method of precoating workpices with films of tin-silver alloy solder, and subsequently joining the workpieces without flux by heating them in a vacuum and placing the precoated surfaces in contact with each other with or without applying external pressure, and with or without adding solder between the precoated surfaces.

Significantly, the entire joining operation described by Aoyama (including the application of pressure, if used), must be performed in a vacuum. As a consequence, this approach suffers the inconvenience of requiring large vacuum systems.

Thus, until now, there has been no single technique for mounting solder precoated electronic components that is fluxless, uses solder compositions conventional in the electronic industry, may be performed in the presence of inert gas rather than in a vacuum, and requires no additional solder.

SUMMARY OF THE INVENTION

It has been found that surfaces precoated with solder, e.g. solder of a composition conventional in the electronics industry, can be reliably joined without flux or reducing gases, and without added solder. The surfaces to be joined are brought into mutual contact and heated to melt (i.e., to "reflow") the solder. While the solder is molten, inert gas is flowed over the articles being joined. (By an "inert gas" is meant a gas or gaseous mixture that does not react to a significant extent with air or with the solder being used, or with the metal surfaces being joined, at or below any temperature applied to the surfaces being joined during the soldering process, for example, up to about 300° C.) In addition, compressive force is applied to the joint region while the solder is molten.

A typical application of the invention for, e.g., surface-mounting an IC package, involves bringing a solder-coated portion of a lead on an IC package into contact with a solder-coated portion of a substrate. With inert gas, e.g., nitrogen or argon, flowing over the pieces being joined, modest pressure is applied while the solder is reflowed for, typically 5-15 seconds. The joint is then allowed to cool.

BRIEF DESCRIPTION OF THE DRAWINGS

The invention is described with reference to the accompanying drawings, wherein.

DETAILED DESCRIPTION

Thus, in one aspect, the invention is a method for mounting an electronic device that has at least one solder-coated metallic contact on a substrate that also has at least one solder-coated metallic contact. In that aspect, the invention comprises the steps of heating the device contact and the substrate contact to an elevated temperature in the absence of flux; during the heating step, applying pressure between the device contact and the substrate contact; flowing inert gas over the device contact and the substrate contact during the heating and pressure-applying steps, and cooling the device contact and the substrate contact, for example, cooling the contacts passively be withdrawing the source of heat and permitting the temperature of the contacts to decrease below the melting point of the solder. The elevated temperature should be sufficient to melt the solder, but not great enough to harm the electronic device or packaging. The applied pressure should be great enough to insure intimate contact between the surfaces being joined over the entire area of the joint, and should also be great enough to break through the oxide layers on the surfaces to be joined. A specific, and currently preferred, embodiment of this aspect of the invention is described below.

Figure 1:
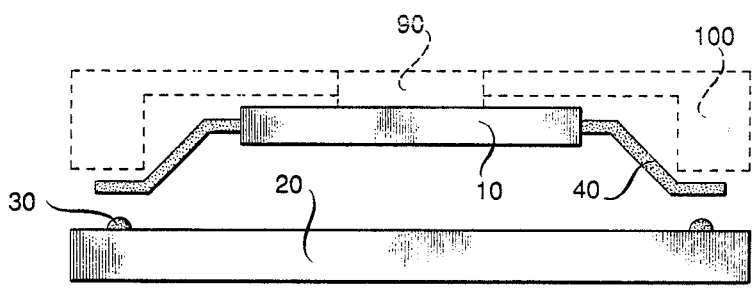
FIG. 1 is a schematic end view of an exemplary IC package having wire leads, the package aligned relative to contacts on a substrate.

With reference to FIG. 1, the inventive method is readily applied to mounting an electronic IC package, for example, a gullwing-type package 10, on a printed wiring board 20. The printed wiring board includes contact pads 30 that are precoated with solder. The package has leads 40 that are to be soldered to corresponding contact pads on the printed wiring board. The leads are also precoated with solder.

Any solder composition is suitable, limited only by manufacturing requirements, for example, the requirement that the melting point of the solder be low enough to be compatible with the thermal damage threshold of the packaging material. A typical and currently preferred solder composition is 60/40 solder, by which is meant solder that is nominally 60% tin and 40% lead.

The solder on the printed wiring board must be thick enough to insure that a layer of unoxidized solder will be present below the surface oxide layer. Thus, the solder thickness on the printed wiring board should be greater than 1 $\mu$m, and is preferably in the range 30-38 $\mu$m.

Figure 2:
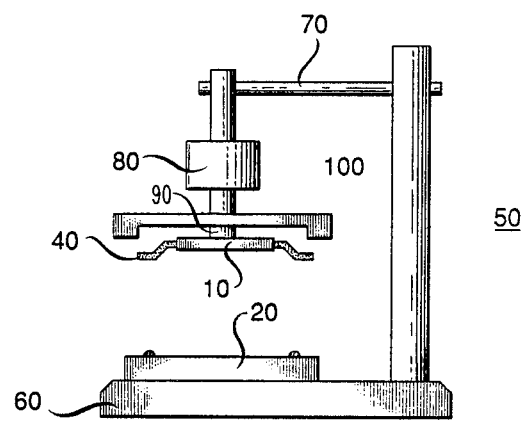
FIG. 2 is a schematic side view of an exemplary assembly machine for use in practicing the inventive method.

The contact is made by heating the surfaces to be joined by flowing heated inert gas over them, and simultaneously applying pressure. The heat and pressure are applied, for example, by using an assembly machine, such as the assembly machine 50 of FIG. 2. Machine 50 comprises a base plate 60, a moveable arm 70 with a pneumatic driver 80, and, on the end of arm 70, a vacuum chuck 90.

Significantly, the contact is made in an open environment. That is, air is excluded from the joint region by the flow of inert gas, and not by placing the workpieces in a sealed chamber.

Printed wiring board 20 is fixed in position on base plate 60. Package 10 is affixed by vacuum chuck 90 to moveable arm 70, which brings the package into position above the printed wiring board, such that the leads are aligned above the corresponding contact pads, and lowers the package onto the printed wiring board. The alignment is accomplished, for example, by means of a computerized pattern recognition system, which controls the movements of the moveable arm. Via pneumatic driver 80 and vacuum chuck 90, arm 70 also applies pressure between the pairs of surfaces to be joined, by applying force to the top of the package. A practical amount of force to be applied to an exemplary package having 132 leads with a pitch of 25 mil (635 μm) is about 7-20 pounds (30-89 Nt), and a typical and currently preferred amount of force is about 7-9 pounds (30-40 Nt). At forces less than 7 pounds (30 Nt) applied to the exemplary package, yields may be reduced due to insufficient pressure. On the other hand, forces in excess of 20 pounds (89 Nt) will distort the leads. Typically, the exemplary package has a total contact area of about 0.0226 in$^2$ (0.146 cm$^2$), and thus, over the practical range of applied force, the average pressure in the contact region ranges from about 309 psi to about 884 psi (about 214 Nt/cm$^2$ to about 612 Nt/cm$^2$). The average applied force per lead in the practical force range is 0.053-0.152 pounds (0.227-0.674 Nt) per lead.

Figure 3:
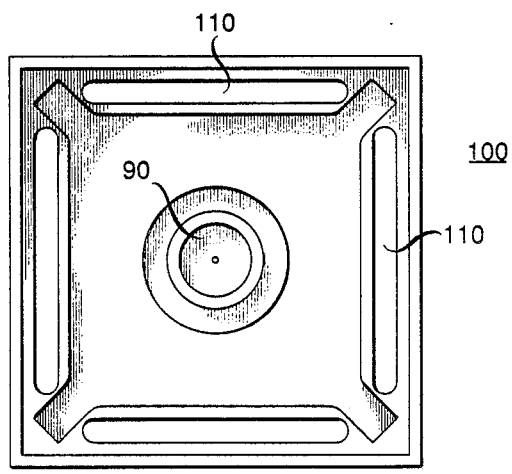
FIG. 3 is a schematic bottom view of the vacuum chuck and annular nozzles of the assembly machine of FIG. 2.

With reference to FIG. 3, vacuum chuck 90 is mounted in the center of the bottom face of hot gas fixture 100. Concentric with the vacuum chuck is an annular arrangement of nozzles 110. The mouths of nozzles 110 collectively define a square or rectangular annulus which approximately coincides with the annulus defined by the leads exiting the package. Heated gas from a reservoir flows out through nozzles 110. The gas may be, for example, air, or it may be an inert gas such as nitrogen or argon. An inert gas is preferable for the purpose of fluxless soldering. Nitrogen is preferable over argon because it is less expensive than argon.

Referring back to FIG. 2, vacuum chuck 90 is brough down onto a package, and the chuck is activated by opening a vacuum line, as is well-known in the art. Package 10 becomes affixed to the vacuum chuck when the vacuum line is opened. Package 10 is lifted by raising the vacuum chuck, and at approximately the same time as the lifting of the package, a flow of hot inert gas from nozzles 110 is initiated. Package 10 is then positioned over a set of contact pads on the printed wiring board that correspond to the leads on the package. With the vacuum line still open, the vacuum chuck is brought down, pressing the package onto the printed wiring board with a predetermined total force. The gas flow, vacuum, and force are maintained for a predetermined period of time, here called the "hold-down period." At the end of the hold-down period, the vacuum line is closed, releasing the package from the vacuum chuck, and the heat and pressure are removed by withdrawing the vacuum chuck and hot gas fixture. Alternatively, the vacuum line can be closed after only part of the hold-down period, for example, after the first 5 seconds of a 15-second hold-down period. This may be advantageous because it permits the package to move laterally into a more stable position during the time that the solder is softened or molten.

Where, for example, the solder is 60/40 solder, the temperature of the heated inert gas should be at least about 180° C. in order to melt the solder. However, the temperature of the heated inert gas should also be less than the ignition temperature of the polymeric packaging material, which is typically about 300° C., and preferably also low enough to prevent regions of the polymeric packaging material near the leads from reaching temperatures at which thermally induced cracking and delamination of the packaging material occur. The threshold temperature for such cracking and delamination is 100° C.

Thus, the inert gas is preferably heated to about 250° C. At this temperature, good reflow occurs in about 15 seconds. For economic reasons, that is, in order to have relatively high throughput, it is desirable to keep the cycle time short, and therefore temperatures substantially lower than 250° C., which require hold-down periods longer than about 15 seconds, are less advantageous. It is also possible to apply gas temperatures substantially greater than 250° C. in non-equilibrium heating, together with very short hold-down periods, such that the joint is formed while the solder surfaces are still substantially hotter than adjacent regions.

The flow rate of the heated inert gas should be adjusted to provide good heat transfer and temperature control. If the flow rate is too low, the joint region will not be effectively heated by the heated gas. On the other hand, if the flow rate is too high, the flowing gas, itself, will not be effectively heated and will thus be unable to effectively heat the joint region. The flow rate must also be small enough to avoid overheating areas adjacent to the joint region, and of course to avoid moving the molten solder away from the joint region. An exemplary range for the flow rate is 40-100 standard cubic feet per hours (SCFH) (1130-2830 Standard Liters/hour), and the rate is preferably about 45 SCFH (1270 Standard Liters/hour).

The predetermined applied force should be sufficient to planarize all of the leads from the package; i.e., to force them into 100% contact with the contact pads on the printed wiring board. For example, if a gullwing-type package having 132 leads is used, the applied force should be at least about nine pounds (40 Newtons (Nt)). However, the force should not be so great that the leads deform inelastically. Significantly, a force great to planarize the leads is sufficient to break through the oxide layers on the surfaces to be joined.

EXAMPLE

Six IC packages, each having 132 gullwing leads with a pitch of 25 mil (635 μm), were mounted on a printed wiring board. The heated inert gas was nitrogen, at an average temperature of about 255° C. (In a plane transverse to the flow direction, the local gas temperature ranged from 250°-264° C.) The flow rate was 45 SCFH (1270 Liters/hour). A total force of 8.5 pounds (38 Nt) was applied to each package for a duration of 15 seconds. The total area of contact between the leads and the printed wiring board was about 0.0226 in$^2$ (0.146 cm$^2$), and thus the average pressure in the contact region was about 376 psi (260 Nt/cm$^2$). All of the interconnections of the six packages were found to be adequately conductive, and none were found to be shorted. The printed wiring board bearing the six packages was subjected to a temperature-humidity test at 75° C. and 85% relative humidity. The resulting means change in resistance was 2 milliohms per test point. Each test point included 16 interconnections and associated wiring on the printed wiring board.

In a test of interconnection yield, 9 boards, each bearing 6 packages, were assembled as described above. Of 3,456 leads tested, one was found to be open, giving an interconnection yield of 99.97%. None of the leads were found to be shorted.

We claim:

1. A method for manufacturing a compound article, comprising the steps of:

providing a first article comprising an electronics package, the package including at least one wire lead, the lead having a first solder-coated surface;

providing a second article comprising a base member, the base member including at least one metallic contact having a second solder coated surface;

bringing the first and second articles together such that the first and second solder-coated surfaces make contact with each other in the absence of flux;

heating the first and second solder-coated surfaces, in the absence of flux, to at least the melting point of the solder on the first and second solder-coated surfaces;

during the heating step, applying a force to the first and second articles whereby the first and second solder-coated surfaces are pressed together;

and permitting the articles to cool, whereby the compound article is formed, characterized in that the method further comprises, during the heating step, the step of flowing inert gas over the first and second articles in an open environment; during the heating step, the first and second solder-coated surfaces are heated to not more than about 300° C.; and in the force-applying step, the force is sufficient to break through oxide layers that may be present on the first and second solder-coated surfaces.

2. The method of claim 1, further comprising the step of heating the inert gas, and wherein the step of heating the first and second solder-coated surfaces comprises flowing the heated inert gas over the first and second solder-coated surfaces.

3. The method of claim 2, wherein the inert gas is nitrogen or argon.

4. The method of claim 2, wherein the wire leads are gullwing leads, and the force-applying step is apapted to create between the first and second solder-coated surfaces an average pressure of at least about 309 psi (214 Nt/cm$^2$) but not more than about 884 psi (612 Nt/cm$^2$).

5. The method of claim 2, wherein the step of heating the first and second solder-coated surfaces further comprises the steps of:

activating a vacuum chuck;
affixing the package to the vacuum chuck by suction;
flowing the heated inert gas over the lead;
while flowing the heated inert gas over the lead, positioning the vacuum chuck relative to the base member such that the lead is aligned with and touching the contact and such that the heated inert gas flows over the contact; and
deactivating the vacuum chuck.

* * * * *

UNITED STATES PATENT AND TRADEMARK OFFICE
CERTIFICATE OF CORRECTION

PATENT NO. : 4,979,664

DATED : December 25, 1990

INVENTOR(S) : A. M. Lyons

It is certified that error appears in the above-identified patent and that said Letters Patent is hereby corrected as shown below:

Column 8, line 11 "apapted" should read --adapted--

Signed and Sealed this

Eighth Day of September, 1992

Attest:

DOUGLAS B. COMER

Attesting Officer

Acting Commissioner of Patents and Trademarks